United States Patent
Cheng

(10) Patent No.: US 11,250,786 B2
(45) Date of Patent: Feb. 15, 2022

(54) ARRAY SUBSTRATE, DISPLAY PANEL AND DISPLAY APPARATUS

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Hongfei Cheng, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/763,405

(22) PCT Filed: Dec. 24, 2019

(86) PCT No.: PCT/CN2019/127853
§ 371 (c)(1),
(2) Date: May 12, 2020

(87) PCT Pub. No.: WO2020/192208
PCT Pub. Date: Oct. 1, 2020

(65) Prior Publication Data
US 2021/0272523 A1    Sep. 2, 2021

(30) Foreign Application Priority Data
Mar. 27, 2019  (CN) .......................... 201910239485.2

(51) Int. Cl.
*H01L 27/32*  (2006.01)
*G09G 3/3275*  (2016.01)

(52) U.S. Cl.
CPC ....... *G09G 3/3275* (2013.01); *H01L 27/3276* (2013.01); *G09G 2300/0426* (2013.01)

(58) Field of Classification Search
CPC .......... G09G 3/3275; G09G 2300/0426; H01L 27/3276
(Continued)

(56) References Cited

U.S. PATENT DOCUMENTS 7,545,348 B2   6/2009  Tseng et al.
8,749,459 B2   6/2014  Shin et al.
(Continued)

FOREIGN PATENT DOCUMENTS

CN    1996446 A    7/2007
CN    101118724 A   2/2008
(Continued)

OTHER PUBLICATIONS

Office Action dated Mar. 15, 2021, issued in counterpart CN Application No. 201910239485.2, with English Translation. (22 pages).
(Continued)

*Primary Examiner* — Abdul-Samad A Adediran
(74) *Attorney, Agent, or Firm* — Westerman, Hattori, Daniels & Adrian, LLP

(57) ABSTRACT

The present disclosure relates to an array substrate. The array substrate may include a pixel unit. The pixel unit may include a third transistor, a sixth transistor, a light emitting device, and a boosting capacitor. The boosting capacitor may include a first electrode and a second electrode. A control terminal, a first terminal, and a second terminal of the third transistor may be electrically connected to a first node, a second node, and a third node, respectively. A control terminal, a first terminal and a second terminal of the sixth transistor may be electrically connected to an emission signal line, a first terminal of the light emitting device, and the second node, respectively. The first electrode and the
(Continued)

second electrode of the boosting capacitor may be electrically connected to a gate line and the first node, respectively.

15 Claims, 10 Drawing Sheets

(58) Field of Classification Search
USPC .................................................. 1/1; 257/71
See application file for complete search history.

(56) References Cited

U.S. PATENT DOCUMENTS

| | | | |
|---|---|---|---|
| 2011/0227893 A1 | 9/2011 | Bae et al. | |
| 2013/0207117 A1* | 8/2013 | An ...................... | H01L 27/3276 257/71 |
| 2016/0321995 A1* | 11/2016 | Shin .................... | H01L 27/3276 |

FOREIGN PATENT DOCUMENTS

| CN | 102194404 A | 9/2011 |
|---|---|---|
| CN | 103247660 A | 8/2013 |
| CN | 103489889 A | 1/2014 |
| CN | 205541823 U | 8/2016 |
| CN | 109524447 A | 3/2019 |
| WO | 2018/225203 A1 | 12/2018 |

OTHER PUBLICATIONS

International Search Report dated Mar. 24, 2020, issued in counterpart application No. PCT/CN2019/127853 (11 pages).

* cited by examiner

ARRAY SUBSTRATE, DISPLAY PANEL AND DISPLAY APPARATUS

CROSS-REFERENCE TO RELATED APPLICATIONS

This application claims benefit of the filing date of Chinese Patent Application No. 201910239485.2 filed on Mar. 27, 2019, the disclosure of which is hereby incorporated in its entirety by reference.

TECHNICAL FIELD

The present disclosure relates to display technologies, and in particular, to an array substrate, a display panel, and a display apparatus.

BACKGROUND

An array substrate of an organic light emitting diode (OLED) display device usually includes data lines and gate lines. In order to reduce the number of data drivers, demultiplexers are typically employed in the array substrate, which is a very common approach to a small mobile display device.

In the array substrate using the demultiplexers, the voltage written to a storage capacitor decreases due to the parasitic capacitance, which reduces the display brightness, thereby affecting the display effect of the display devices.

BRIEF SUMMARY

One embodiment of the present disclosure provides an array substrate. The array substrate may include a pixel unit. The pixel unit may include a third transistor, a sixth transistor, a light emitting device, and a boosting capacitor. The boosting capacitor may include a first electrode and a second electrode. A control terminal, a first terminal, and a second terminal of the third transistor may be electrically connected to a first node, a second node, and a third node, respectively. A control terminal, a first terminal and a second terminal of the sixth transistor may be electrically connected to an emission signal line, a first terminal of the light emitting device, and the second node, respectively. The first electrode and the second electrode of the boosting capacitor may be electrically connected to a gate line and the first node, respectively.

Optionally, the pixel unit may further include a storage capacitor, and two terminals of the storage capacitor may be electrically connected to a first power signal line and the first node, respectively.

Optionally, the boosting capacitor may be configured to boost a control terminal voltage of the third transistor and a voltage of the storage capacitor, thereby increasing driving current transmitted to the light emitting device.

Optionally, the pixel unit may further include a first transistor, a second transistor, a fourth transistor, and a fifth transistor. A control terminal, a first terminal and a second terminal of the first transistor may be electrically connected to a reset signal line of the pixel unit, a second power signal line, and the first node, respectively. A control terminal, a first terminal, and a second terminal of the second transistor may be electrically connected to the gate line, the first node, and the second node, respectively. A control terminal, a first terminal, and a second terminal of the fourth transistor may be electrically connected to the gate line, a data line, and the third node, respectively. A control terminal, a first terminal, and a second terminal of the fifth transistor may be electrically connected to the emission signal line, the first power signal line, and the third node, respectively.

Optionally, the pixel unit may further include a seventh transistor. A control terminal, a first terminal, and a second terminal of the seventh transistor may be electrically connected to a reset signal line of an adjacent pixel unit, the second power signal line, and the first terminal of the light emitting device.

Optionally, the first electrode of the boosting capacitor may be at least a portion of a connecting electrode in a data line layer, the connecting, electrode may be a conductive line in the data line layer connecting the control terminal of the third transistor and the second terminal of the first transistor, and the second electrode of the boosting capacitor may be a portion of the gate line in a first gate metal layer that overlaps the first electrode.

Optionally, a second gate metal layer may be disposed between the data line layer and the first gate metal layer, and the first electrode and the second electrode may have an overlapping area with the second gate metal layer, respectively.

Optionally, a width of a first designated area of the connecting electrode may be greater than a width of other areas of the connecting electrode, and the first designated area may include an area where the first electrode is located.

Optionally, a width of a second designated region in the gate line may be larger than a width of other areas of the gate line, and the second designated region may include an area where the second electrode is located.

Optionally, the first electrode of the boosting capacitor may be at least a portion of a second gate metal layer, and the second electrode of the boosting capacitor may be a portion of the gate line in a first gate metal layer that overlaps the first electrode.

Optionally, the first electrode of the boosting capacitor may be connected to a connecting electrode in a data line layer through a via hole, and the connecting electrode may be a conductive line in the data line layer connecting the control terminal of the third transistor and the second terminal of the first transistor.

Optionally, the first electrode of the boosting capacitor may be at least a portion of a connecting electrode of a data line layer, and the connecting electrode may be a conductive line in the date line layer connecting the control terminal of the third transistor and the second terminal of the first transistor, and the second electrode may be a portion of a second gate metal layer that overlaps the connecting electrode.

Optionally, the second electrode may be connected to the gate line of a first gate metal layer through a via hole.

Optionally, the first transistor, the second transistor, the third transistor, the fourth transistor, the fifth transistor, the sixth transistor, and the seventh transistor may be thin film transistors.

Optionally, the thin film transistors may be made of low temperature polysilicon.

Optionally, the light emitting device may be an OLED, and the first and second terminals of the light emitting device may be an anode and a cathode of the OLED, respectively.

Another embodiment of the present disclosure provides a display panel, comprising the array substrate.

Another embodiment of the present disclosure provides a display apparatus, comprising the display panel.

BRIEF DESCRIPTION OF THE DRAWINGS

The drawings are intended to provide a further understanding of the technical solutions of the present disclosure, and are intended to be a part of the specification, and are used to explain the technical solutions of the present disclosure, and do not constitute a limitation or the technical solutions of the present disclosure.

The aspects and advantages of the present disclosure will become obvious and easy to understand from the following description of the embodiments in conjunction with the drawings.

DETAILED DESCRIPTION

Figure 1:
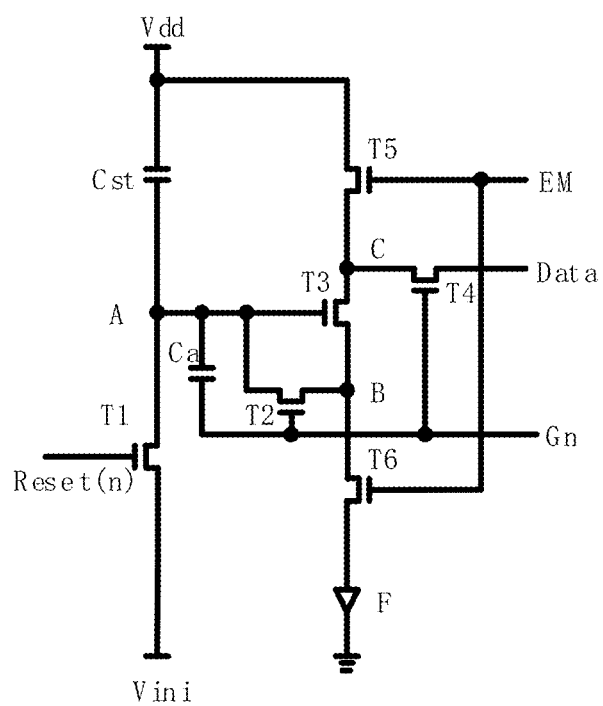
FIG. 1 is a schematic diagram of a pixel circuit of an array substrate according to one embodiment of the present disclosure.

The present disclosure is described in detail below, and examples of embodiments of the present disclosure are illustrated in the accompanying drawings, wherein the same or similar reference numerals refer to the same or similar components or components having the same or similar functions. Furthermore, if a detailed description of a known technique is unnecessary for the features of the present application shown, it will be not described herein. The embodiments described below with reference to the accompanying drawings are intended to be illustrative only, and are not to be construed as a limitation of the present disclosure.

Those skilled in the art will appreciate that all terms (including technical and scientific terms) used herein have the same meaning as commonly understood by one of ordinary skill in the art to which this disclosure belongs, unless otherwise defined. It should also be understood that those terms, as defined in a general dictionary, should be understood as having the meaning consistent with the meaning in the context of the prior art and should not be interpreted with idealized or overly formal meaning unless they were specifically defined herein.

It should be understood that the singular forms "a," "an," and "the" may include plural forms. It should be further understood that the wording used in the specification of the present disclosure "include" refers to the presence of the features, integers, steps, operations, elements and/or components, but does not preclude the presence or addition of one or more other features, integers, steps, operations, components, components and/or their groups. It will be understood that when an element is referred to as being "connected" or "coupled" to another element, it can be directly connected or coupled to the other element, or there may also be intermediate elements. Further. "connected" or "coupled" as used herein may include either a wireless connection or a wireless coupling. The term "and/or" used herein include all or any of the units and combinations of one or more associated listed items.

In the current array substrates, a demultiplexer first inputs a data signal into a data line. There is parasitic capacitance on each data line, and the input data signal is stored in the parasitic capacitors. When a gate line turns on a switching device in a pixel unit, electrical charges in the parasitic capacitors charge the storage capacitor in the pixel unit. The electrical charges are shared by the parasitic capacitor and the storage capacitor, thereby reducing the voltage Vst on the storage capacitor. The magnitude of Vst depends on the value of the parasitic capacitance.

The following embodiments may be combined with each other, and the same or similar concepts or processes may not be repeated in some embodiments. The following will be combined with the drawings to describe the embodiments of the present disclosure.

One embodiment of the present disclosure provides an array substrate. The array substrate includes a plurality of pixel units arranged in an array. Each pixel unit is connected to a data line Data, a gate line Gn, a first power signal line Vdd, a second power signal line Vini, an emission signal line EM and a reset signal line RESET(n), respectively. The circuit of each pixel unit, as shown in FIG. 1, includes a storage capacitor Cst, a boosting capacitor Ca, a first transistor T1, a second transistor T2, a third transistor T3, a fourth transistor T4, a fifth transistor T5, a sixth transistor T6, and a light emitting device F.

The two electrodes of the storage capacitor Cst are electrically connected to the first power signal line Vdd and the first node A, respectively; the two electrodes of the boost capacitor Ca are electrically connected to the gate line Gn and the first node A, respectively.

The control terminal, the first terminal, and the second terminal of the first transistor T1 are electrically connected to the reset signal line Reset(n), the second power signal line Vini, and the first node A of a corresponding pixel unit, respectively. The control terminal, the first terminal, and the second terminal of the second transistor T2 are electrically connected to the gate line Gn, the first node A, and the second node B, respectively.

The control terminal, the first terminal, and the second terminal of the third transistor T3 are electrically connected to the first node A, the second node B, and the third node C, respectively. The control terminal, the first terminal, and the second terminal of the fourth transistor T4 are electrically connected to the gate line Gn, the data line Data, and the third node C, respectively.

The control terminal, the first terminal, and the second terminal of the lift transistor T5 are electrically connected to the emission signal line EM, the first power signal line Vdd, and the third node C, respectively. The control terminal, the first terminal, and the second terminal of the sixth transistor T6 are electrically connected to the emission signal line EM, the first terminal of the light emitting device, and the second node B, respectively.

In the array substrate provided by one embodiment of the present disclosure, a boosting capacitor Ca is disposed between the control terminal of the third transistor T3 and the gate line Gn. The boosting capacitor Ca acts as a voltage boosting device to increase the control terminal voltage of the third transistor T3 and also increase the voltage Vst of the storage capacitor Cst. Consequently, the third transistor T3 can be turned on more fully, thereby boosting the driving current transmitted from the third transistor T3 to the light emitting device, increasing the display brightness, and improving the display effect. The principle will be further explained in the following content.

Figure 2:
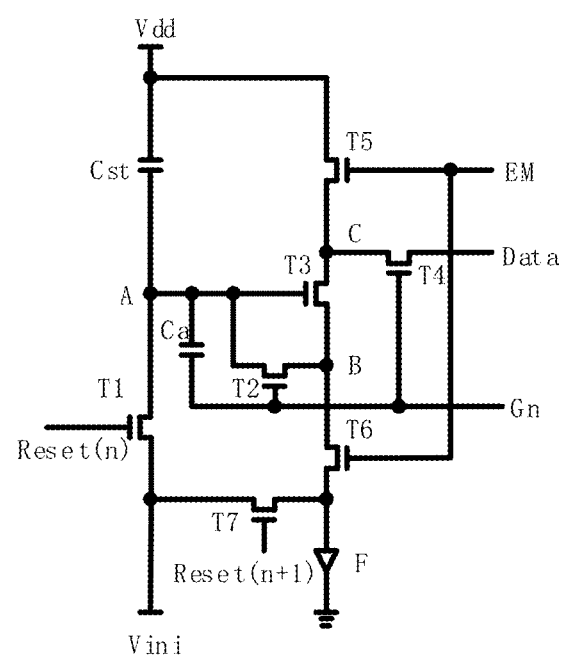
FIG. 2 is a schematic diagram of a pixel circuit of an array substrate according to one embodiment of the present disclosure.

Optionally, as shown in FIG. 2, the pixel unit in one embodiment further includes a seventh transistor T7. The control terminal, the first terminal, and the second terminal of the seventh transistor T7 are electrically connected to the adjacent pixel unit's reset signal line Reset(n+1), the second power signal line Vini, and the first terminal of the light emitting device, respectively. The adjacent pixel unit is a pixel unit that is adjacent to and in the same column as the pixel unit in which the seventh transistor T7 is located.

In one embodiment, for a pixel circuit composed of a plurality of rows and columns of pixel units, if the pixel unit of the seventh transistor T7 is located in the nth row and the mth column and Reset(n) represents a reset signal line of the pixel unit in the nth row and the mth column, the adjacent pixel unit may refer to the pixel unit located in the (n+1)th row and the nth column, and Reset(n+1) represents the reset signal line of the pixel unit in the (n+1)th row and the mth column.

Those skilled in the art can understand the above-mentioned concept of row and column. For example, in one case, the extending direction of the gate line Gn is the row direction, and a same gate line Gn corresponds to pixel units of the same row. The extending direction of the data line Data is the column direction, a same data line Data corresponds to pixel units of the same column, and details are not repeated herein.

Optionally, the first to seventh transistors (T1 to T7) in some embodiments may be TFTs (thin film transistors) or other devices with the same or similar characteristics. When a transistor is a TFT, the control terminal of the transistor may be the gate of the TFT, and the first and second terminals may be the source or drain of the TFT.

Optionally, when the transistor in some embodiments is a TFT, the TFT may be made of low temperature polysilicon. The turn-on signal of the TFT may be a low potential signal, that is, when the input is a low potential signal, the TFT can be turned on.

Optionally, the light emitting device in one embodiment may be OLED. Correspondingly, the first and second terminals of the light emitting device may be an anode and a cathode of the OLED, respectively.

Figure 3:
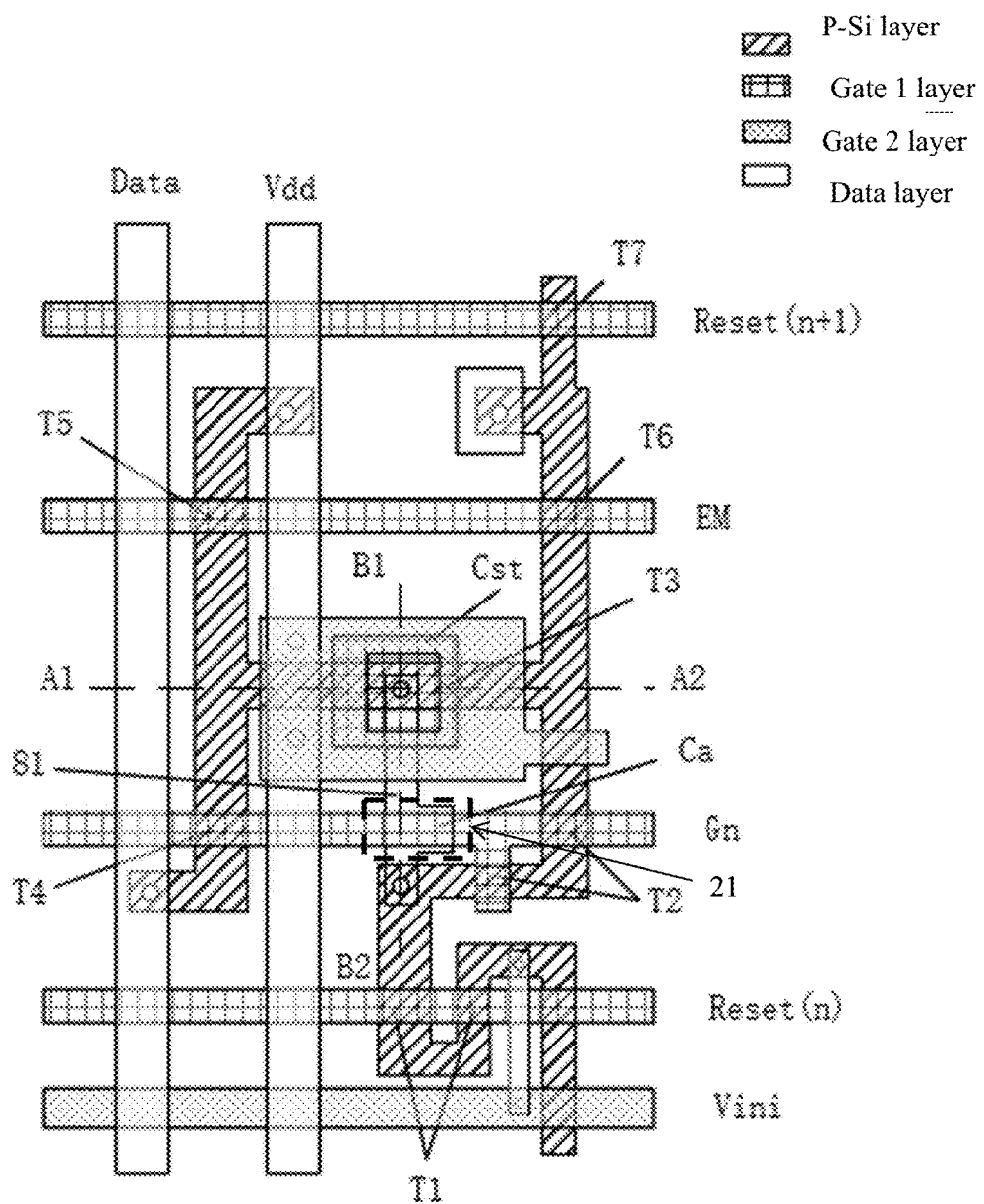
FIG. 3 is a schematic diagram of a wiring layout of an array substrate according to one embodiment of the present disclosure.
Figure 4:
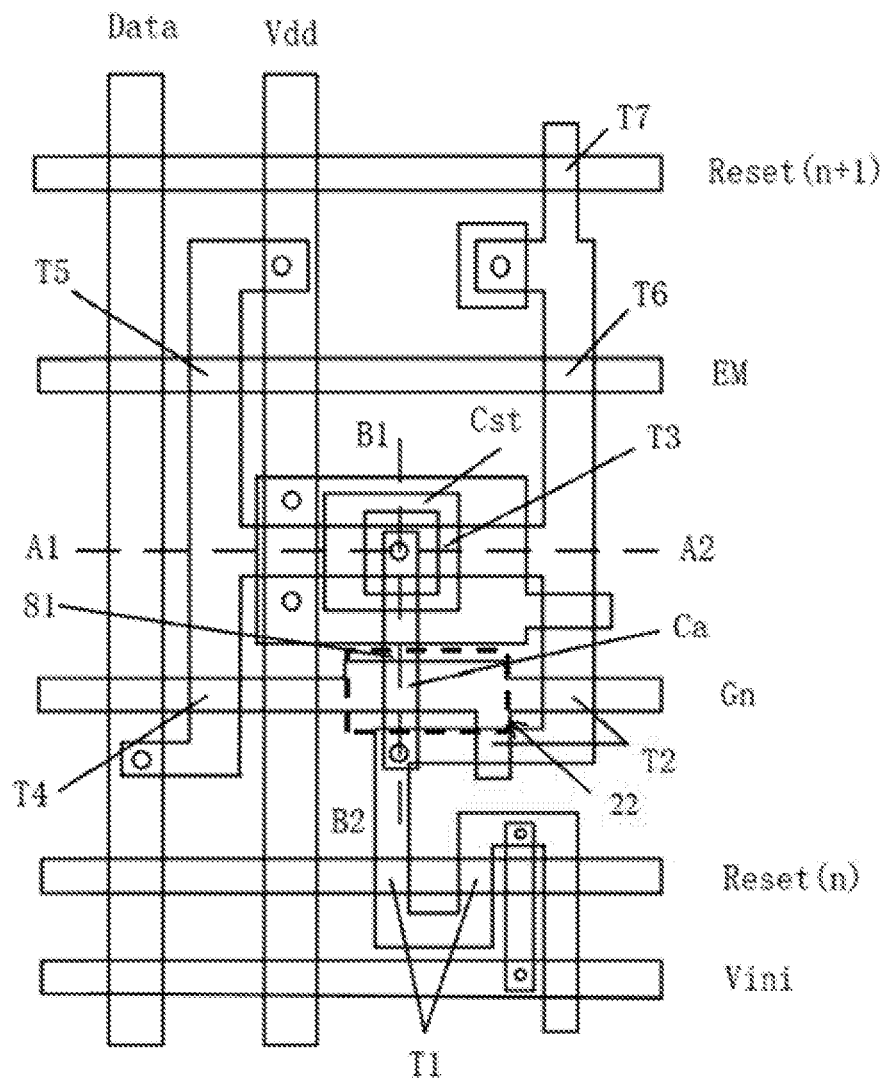
FIG. 4 is a schematic diagram of a wiring layout of an array substrate according to one embodiment of the present disclosure.
Figure 5:
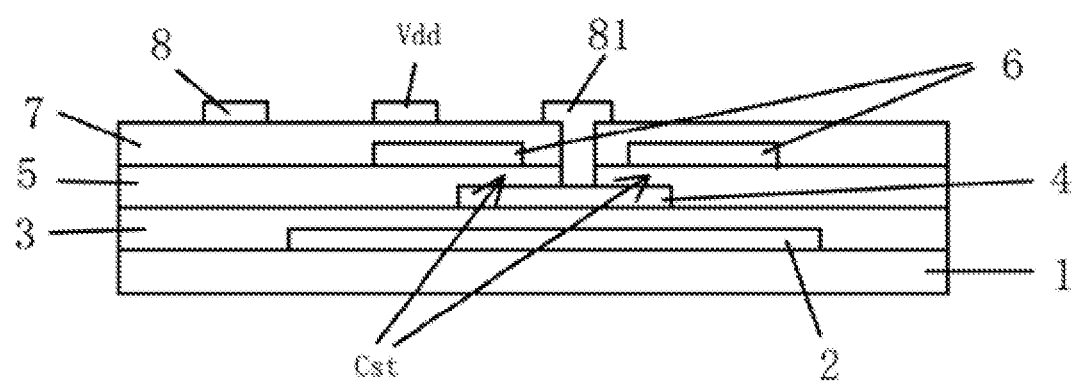
FIG. 5 is a cross-sectional view along line A1-A2 of FIGS. 3 and 4.
Figure 6:
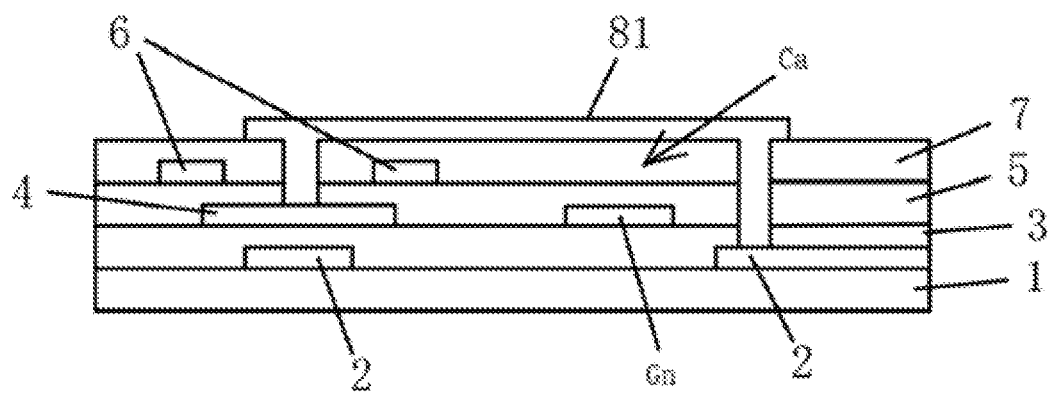
FIG. 6 is a cross-sectional view along line B1-B2 of FIGS. 3 and 4.

In one embodiment, the boosting capacitor may have the following configurations:

In one embodiment, the boosting capacitor Ca is formed by using the connecting electrode of the data line layer and the gate line Gn of the first gate metal layer as two electrodes. The structure is as follows:

FIGS. 3 and 4 respectively show two types of pixel wiring layouts in the array substrate. FIGS. 5 and 6 are a cross-sectional view along A1-A2 in FIGS. 3 and 4 and a cross-sectional view along B1-B2 in FIGS. 3 and 4, respectively.

In some embodiments of the present disclosure, as shown in FIGS. 5 and 6, the following layers in the array substrate are generally formed on the substrate 1 as follows: a low temperature polysilicon TFT layer (P—Si layer) 2, a first gate insulating layer 3, a first gate metal layer (Gate 1 layer) 4, a second gate insulating layer 5, a second gate metal layer (Gate 2 layer) 6, an interlayer insulating layer 7, and a data line layer (data layer) 8. It should be understood by those skilled in the art that the array substrate further may include a via hole structure for connecting the layers. The relative positional relationship of each layer in FIG. 4 is the same as or similar to that of FIG. 3, and will not be repeated herein.

In some embodiments of the present disclosure, as shown in FIGS. 3 to 6, the first and second terminals of the transistors T1 to T7 are located in the P—Si layer. The control terminals of the transistors T1 to T7 are located in the Gate 1 layer or the Gate layer. The emission signal line EM, the gate line Gn, one electrode of the storage capacitor Cst, and the reset signal lines Reset(n) and Reset(n+1) are all located in the Gate 1 layer. The data line Data and the first power signal line Vdd are both located in the data line layer. The other electrode of the storage capacitor Cst and the second power signal line Vini are located in the Gate 2 layer. The electrode of the storage capacitor Cst located in the Gate 1 layer also serves as the control terminal of the transistor T3, and the second terminal oldie transistor T1 is located in the P—Si layer of the right side of FIG. 6.

In some embodiments of the present disclosure, as shown in FIGS. 3 to 6, the boosting capacitor Ca includes the first electrode and the second electrode opposite each other. The first electrode is at least a portion of a connecting electrode 81 located in the data line layer 8, and the connecting electrode is a conductive line in the data line layer 8 which connects the control terminal of the third transistor T3 and the second terminal of the first transistor of T1. The second electrode is a portion of the gate line Gn of the first gate metal layer 4 that overlaps with the first electrode. The area indicated by the arrows in FIG. 5 is the area between the two electrode plates of the storage capacitor Cst, and the area indicated by the arrow in FIG. 6 is the area between the two electrode plates of the boosting capacitor Ca. Although the via holes are not explicitly shown in FIG. 5 and FIG. 6, it should not affect the understanding of the embodiments of the present disclosure.

Optionally, the width of a first designated area 21 in the connecting electrode is greater than the width of other areas in the connecting electrode as shown in FIG. 3. The first designated area includes the area where the first electrode is located. Optionally, the width of a second designated area 22 in the gate line Gn is greater than the width of other areas in the gate line Gn as shown in FIG. 4. The second designated area includes the area where the second electrode is located. The above width configuration increases the electrode plate area of the boosting capacitor Ca, which in turn increases the capacitance of the boosting capacitor Ca, thereby increasing the gate voltage of the driving transistor T3.

Figure 7:
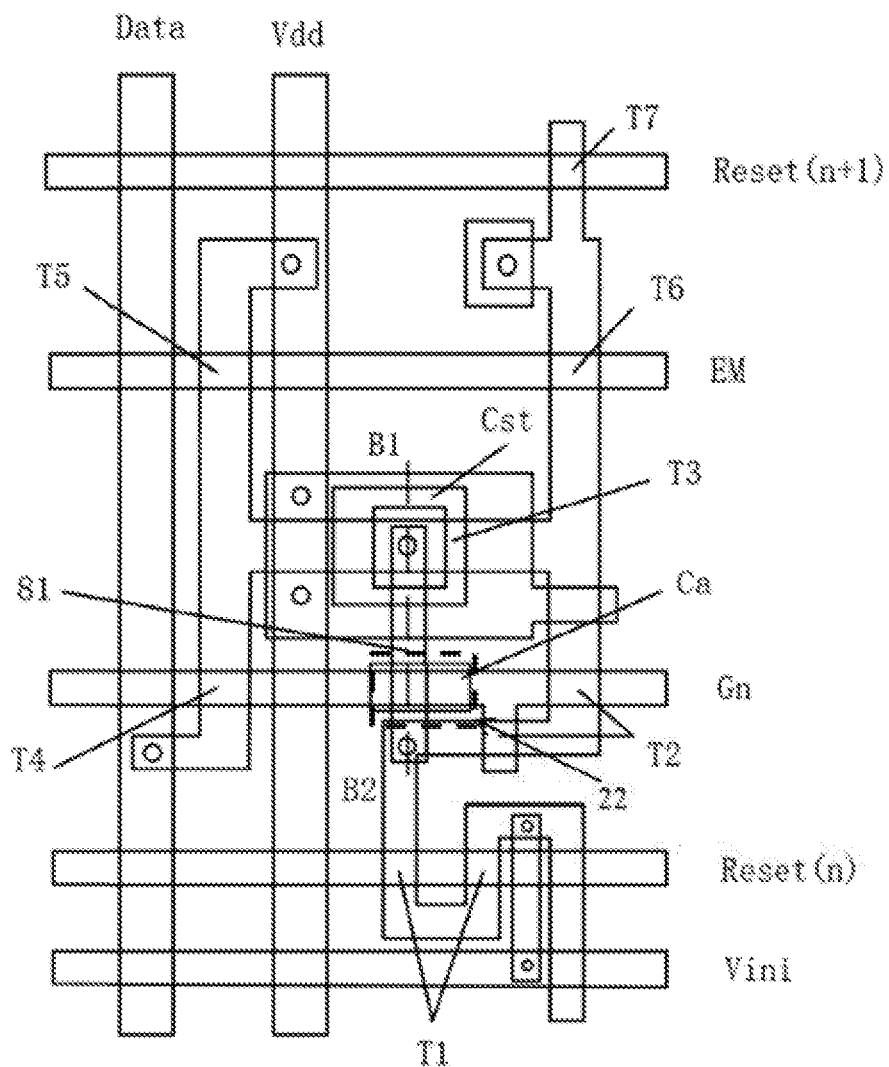
FIG. 7 is a schematic diagram of a wiring layout of an array substrate according to one embodiment of the present disclosure.
Figure 8:
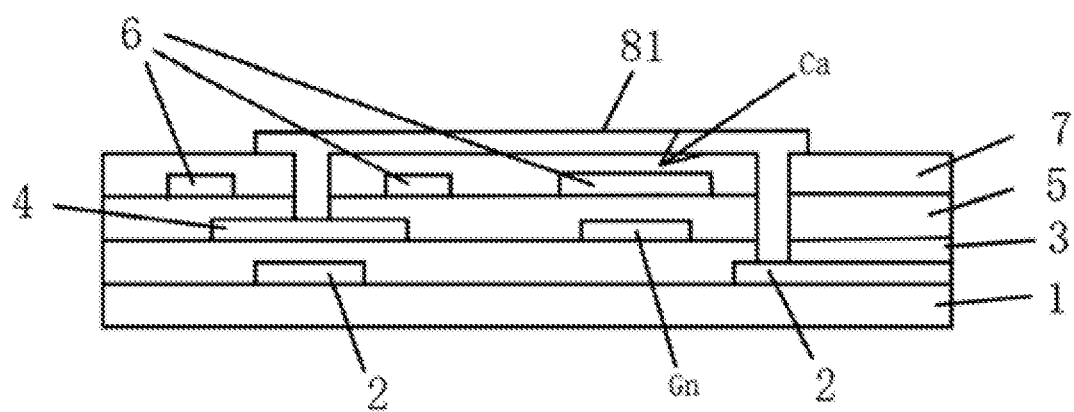
FIG. 8 is a cross-sectional view along line B1-B2 of FIG. 7 according to one embodiment of the present disclosure.

In one embodiment, the boosting capacitor Ca is formed by using the connecting electrode of the data line layer and the gate line Gn of the first gate metal layer as two electrodes. The structure is as follows:

FIG. 7 shows a pixel wiring layout of the array substrate in one embodiment of the present disclosure. A cross-sectional view along B1-B2 in FIG. 7 is illustrated in FIG. 8. The layers and the order of the layers on the substrate 1 in FIG. 7 are the same as those in FIG. 3. The corresponding relationships between the transistors T1 to T7, the emission signal line EM, the gate line Gn, the data line Data, the first power signal line Vdd, the second power signal line Vini, the storage capacitor Cst, and the reset signal line Reset(n) and Reset(n+1) and the layers are as the same as those in FIG. 3. The details thereof are not repeated herein.

As shown in FIG. 7 and FIG. 8, the boosting capacitor Ca includes the first electrode and the second electrode opposite each other. The first electrode is at least a portion of the connecting electrode 81 located in the data line layer 8. The connecting electrode is a conducting line located in the data line layer 8, which connects the control terminal of the third transistor T3 and the second terminal of the first transistor T1. The second electrode is a portion of the gate line Gn of the first gate metal layer 4 that overlaps with the first electrode. As shown in FIG. 8, there is a second gate metal layer 6 between the data line layer 8 and the first gate metal layer 4, and the first electrode and the second electrode have respective overlapping areas with the second gate metal layer 6. The area indicated by the arrow in FIG. 8 is the area between the two electrode plates of the boosting capacitor Ca.

Optionally, in one embodiment, the second gate metal layer 6 is suspended between the data line layer 8 and the first gate metal layer 4, and respectively has overlapping areas with the first electrode and the second electrode, so as to facilitate wiring.

Optionally, in one embodiment, the width of the first designated area in the connecting electrode 21 is greater than the width of other areas in the connecting electrode. The first designated area includes an area where the first electrode is located. In another embodiment, the width of the second designated area 22 in the gate line Gn is larger than the width of other areas in the gate line Gn. The second designated area includes the area where the second electrode is located. The above width configuration can increase the area of the electrode plates of the boosting capacitor Ca, which in turn increases the capacitance of the boosting capacitor Ca, thereby increasing the gate voltage of the drive transistor T3.

Figure 9:
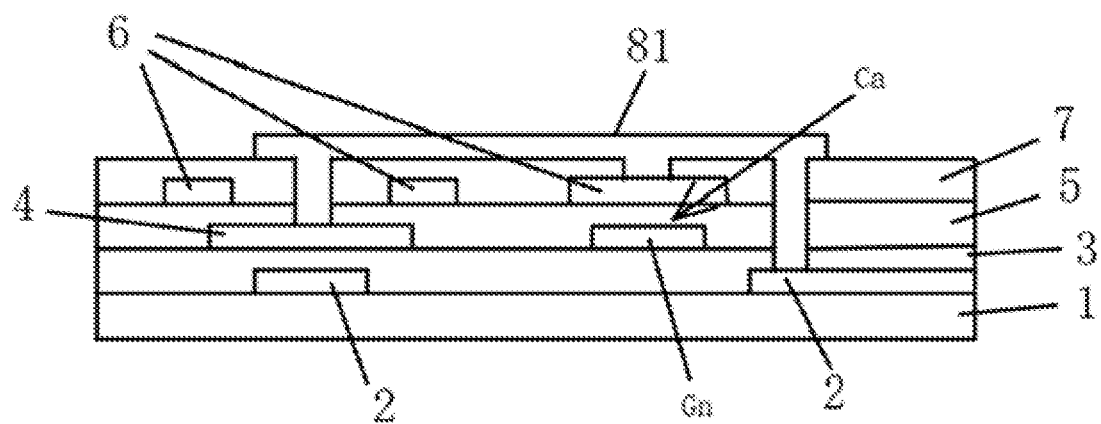
FIG. 9 is a cross-sectional view along line B1-B2 of FIG. 7 according to one embodiment of the present disclosure.

In one embodiment, the boosting capacitor Ca is formed by using the second gate metal layer and the gate line Gn of the first gate metal layer as two electrodes. The structure is as follows:

The pixel wiring layout of the array substrate is the same as or similar to that in FIG. 7, and FIG. 9 shows a cross-sectional view along B1-B2 in FIG. 7.

As shown in FIG. 7 and FIG. 9, the boosting capacitor Ca includes the first electrode and the second electrode opposite each other. The first electrode is at least a portion of the metal of the second gate metal layer 6, and the second electrode is a portion of the gate line Gn of the first gate metal layer that overlaps with the first electrode. The area indicated by the arrow in FIG. 9 is the area between the two electrode plates of the boosting capacitor Ca.

Optionally, as shown in FIG. 7 and FIG. 9, the first electrode is connected to the connecting electrode 81 in the data line layer 8 through a via hole. The connecting electrode is a conducting line located in the data line layer 8, which connects the control terminal of the third transistor T3 and the second terminal of the first transistor T1.

Optionally, in one embodiment, the width of the designated area in the gate line Gn 22 is larger than the width of other areas in the gate line Gn, and the designated area includes the area where the second electrode is located, thereby increasing the electrode plate area of the boosting capacitor Ca.

Figure 10:
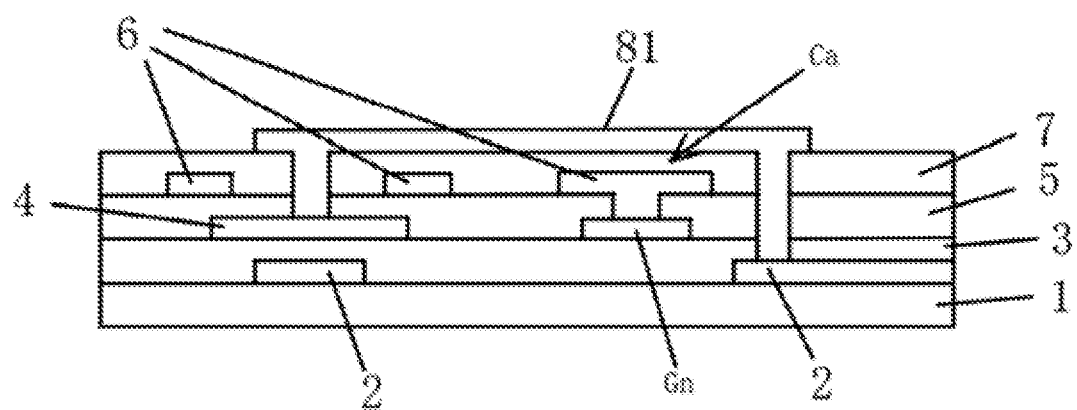
FIG. 10 is a cross-sectional view along line B1-B2 of FIG. 7 according to one embodiment of the present disclosure.

In one embodiment, the boosting capacitor Ca is formed by using the connecting electrode of the data line layer and the second gate metal layer as two electrodes. The structure is as follows:

The pixel wiring layout of the array substrate is the same as or similar to that of FIG. 7, and FIG. 10 shows a cross-sectional view along B1-B2 in FIG. 7.

As shown in FIG. 7 and FIG. 10, the boosting capacitor Ca includes the first electrode and the second electrode opposite each other. The first electrode is at least a portion of the connecting electrode 81 in the data line layer 8, and the connecting electrode is a conducting line located in the data line layer 8, which connects the control terminal of the third transistor T3 and the second terminal of the first transistor T1. The second electrode is a portion of the second gate metal layer 6 that overlaps with the connecting electrode 81. The area indicated by the arrow in FIG. 10 is the area between the two electrode plates of the boosting capacitor Ca.

Optionally, as shown in FIG. 10, the second electrode is connected to the gate line Gn of the first gate metal layer 4 through a via hole.

Optionally, the width of the first designated area in the connecting electrode is greater than the width of other areas in the connecting electrode. The first designated area includes the area where the first electrode is located, thereby increasing the electrode plate area of the boosting capacitor Ca.

Optionally, in one embodiment, in the above configurations, the connecting electrode may be connected to the control terminal of the third transistor T3 and the second terminal of the T1 first transistor, respectively, through a via hole.

It should be noted that the via hole structure is not explicitly shown in the cross-sectional views, but should not affect the understanding of the embodiments of the present disclosure.

The pixel driving principle of the array substrate in some embodiments of the present disclosure is as follows:

As shown in FIG. 2, in one embodiment, the reset signal line Reset(n) turns on the transistor T1, and the storage capacitor Cst stores the voltage input by the second power signal line Vini (indicated by Vini), as described above. The turn-on signal of the transistor may be a low potential signal. When the control signal input from the gate line Gn changes from the low potential signal Vgl to the high potential Vgh, the gate voltage of the transistor 13, the voltages of the storage capacitor Cst and the boosting capacitor Ca changes accordingly.

When the control signal input from the gate line Gn is Vgl, the transistors T2 and T4 are turned on. Due to the parasitic capacitance, the gate voltage of the third transistor T3 is $V'_{g3}$:

$$V'_{g3} = \frac{C_d}{C_{st} * C_d} V_{data} + V_{th} \quad (1)$$

where $V_{data}$ is the data signal voltage input from the data line. $V_{th}$ is the threshold voltage of the transistor T3, $C_{st}$ is the capacitance of the storage capacitor, and $C_d$ is the capacitance of the parasitic capacitor on the data line.

At this time, the voltage difference between the two terminals of the storage capacitor is $(V'_{g3} - V_{dd})$, where $V_{dd}$ is the voltage of the first power signal line. The voltage difference between the two terminals of the boosting capacitor is $(V'_{g3} - V_{gl})$, Reset(n+1) has the same waveform as the input of the gate line Gn. When the transistors T2 and T4 are turned on, the transistor T7 is turned on and the anode voltage of the OLED is initialized to the voltage Vini.

When the control signal input from the gate line Gn switches from $V_{gl}$ to $V_{gh}$, the gate voltage of the transistor T3 is changed from $V'_{g3}$ to $V_{g3}$, the voltage difference between the two terminals or the storage capacitor is changed to $(V_{g3} - V_{dd})$ and the voltage difference between the two terminals of the boosting capacitor is changed to $(V_{g3} - V_{gh})$. According to the law of conservation of charge, the charge have the following relationship:

$$\frac{(V'_{g3}-V_{dd})C_{st}+(V'_{g3}-V_{gl})C_a=(V_{g3}-V_{dd})C_{st}+(V_{g3}-V_{gh})}{C_a} \quad (2)$$

From the expression (2), it can be derived that:

$$V_{g3} = V'_{g3} + C_a \frac{V_{gh}-V_{gl}}{C_{st}+C_a} \quad (3)$$

As seen from the expressions (2) and (3), the voltage of $V_{g3}$ is increased by $C_a V_{gh}-V_{gl}/C_{st}+C_a$ regarding to $V'_{g3}$.

Substituting expression (1) into expression (3) gives:

$$V_{g3} = \frac{C_d}{C_{st}+C_d} V_{data} + V_{th} + C_a \frac{V_{gh}-V_{gl}}{C_{st}+C_a} \quad (4)$$

The transistor T3 is a driving transistor that drives the light emitting device F (such as an OLED) to emit light. The increase of the gate voltage of the drive transistor T3 can increase the driving current of the light emitting device F, thereby increasing the brightness of the light-emitting device. The increased current Id is:

$$I_d = k\left(\frac{C_d}{C_{st}+C_d} V_{data} + V_{th} + C_a \frac{V_{gh}-V_{gl}}{C_{st}+C_a} - V_{dd} - V_{th}\right)^2 \quad (5)$$

$$I_d = k\left(\frac{C_d}{C_{st}+C_d} V_{data} + C_a \frac{V_{gh}-V_{gl}}{C_{st}+C_a} - V_{dd}\right)^2 \quad (6)$$

In the expressions (5) and (6), k is a conductive parameter of the driving transistor T3.

As seen from the expressions (5) and (6), the increased driving current $I_d$ is independent from the magnitude of the threshold voltage $V_{th}$ of the driving transistor T3. Therefore, the pixel circuit of the array substrate in some embodiments of the present disclosure can also compensate the threshold voltage $V_{th}$ of the driving transistor T3 and eliminate the influence of the threshold voltage $V_{th}$ on the driving current $I_d$. The difference in threshold voltages of the driving transistors can be greatly reduced, so that the current supplied to each of the light emitting devices becomes more consistent and the brightness of the display device is more uniform.

Another embodiment of the present disclosure further provides a display panel, including any one of the array substrates in one embodiment of the present disclosure.

Another embodiment of the present disclosure further provides a display apparatus, including any one of the display panels in one embodiment of the present disclosure.

The display panel and the display apparatus in the present disclosure have the same or similar concept and advantageous effect as the array substrate described above, which will not be repeated herein.

In the description of the present disclosure, it should be understood that the terms such as "center", "upper", "lower", "front", "back", "left", "right", "vertical", "horizontal", "top", "bottom", "inside", "outside" and the like are based on the orientation or positional relationship shown in the drawings, and is merely for convenience of description of the present disclosure and is a simplified description, rather than indicating or implying that the device or component referred to must have a particular orientation, and is constructed and operated in a particular orientation, and thus should not to be construed as limiting the disclosure.

The terms "first," "second" and so on are used only for describing purposes and cannot be understood to indicate or imply relative importance or to imply the number of technical features indicated. Thus, features defining "first" and "second" may include one or more of the features either explicitly or implicitly. In the description of the present disclosure, "a plurality" is two or more unless otherwise stated.

In the description of the present disclosure, it should be noted that, unless otherwise expressly specified and qualified, the terms "install", "connect" and "couple" should be understood broadly, and may be fixed or detachable, or with integral connections, or may be directly connected, or may be indirectly connected through an intermediate medium, and may be connected internally in the two elements. The specific meaning of the above terms in the present disclosure can be understood in a specific case by those skilled in the art.

As described in the present disclosure, specific features, structures, materials or features may be combined in an appropriate manner in any one or more embodiments or examples.

The above description is only a partial embodiment of the present disclosure, and it should be noted that those skilled in the art can also make some improvements and modification without departing from the principle of the present disclosure. It should be considered as the scope of the present disclosure.

What is claimed is:

1. An array substrate, comprising:
   a pixel unit, the pixel unit comprising:
   a first transistor;
   a second transistor;
   a third transistor;
   a fourth transistor;
   a fifth transistor;
   a sixth transistor;
   a light emitting device;
   a storage capacitor; and
   a boosting capacitor, the boosting capacitor comprising a first electrode and a second electrode;
   wherein a control terminal, a first terminal, and a second terminal of the third transistor are electrically connected to a first node, a second node, and a third node, respectively; and
   a control terminal, a first terminal and a second terminal of the sixth transistor are electrically connected to an emission signal line, a first terminal of the light emitting device, and the second node, respectively;
   the first electrode and the second electrode of the boosting capacitor are electrically connected to a gate line and the first node, respectively;
   two terminals of the storage capacitor are electrically connected to a first power signal line and the first node, respectively;
   a control terminal, a first terminal and a second terminal of the first transistor are electrically connected to a reset signal line of the pixel unit, a second power signal line, and the first node, respectively;
   a control terminal, a first terminal, and a second terminal of the second transistor are electrically connected to the gate line, the first node, and the second node, respectively;
   a control terminal, a first terminal, and a second terminal of the fourth transistor are electrically connected to the gate line, a data line, and the third node, respectively; and a control terminal, a first terminal, and a second terminal of the fifth transistor are electrically connected to the emission signal line, the first power signal line, and the third node, respectively; and the first electrode of the boosting capacitor is at least a portion of a connecting electrode in a data line layer, the connecting electrode is a conductive line in the data line layer connecting the control terminal of the third transistor and the second terminal of the first transistor, and the second electrode of the boosting capacitor is a portion of the gate line in a first gate metal layer that overlaps the first electrode.

2. The array substrate of claim 1, wherein the boosting capacitor is configured to boost a control terminal voltage of the third transistor and a voltage of the storage capacitor, thereby increasing driving current transmitted to the light emitting device.

3. The array substrate according to claim 1, wherein the pixel unit further comprises a seventh transistor, wherein:

a control terminal, a first terminal, and a second terminal of the seventh transistor are electrically connected to a reset signal line of an adjacent pixel unit, the second power signal line, and the first terminal of the light emitting device.

4. The array substrate according to claim 1, wherein a second gate metal layer is disposed between the data line layer and the first gate metal layer, and the first electrode and the second electrode have an overlapping area with the second gate metal layer, respectively.

5. The array substrate according to claim 1, wherein a width of a first designated area of the connecting electrode is greater than a width of other areas of the connecting electrode, and the first designated area comprises an area where the first electrode is located.

6. The array substrate according to claim 1, wherein a width of a second designated region in the gate line is larger than a width of other areas of the gate line, and the second designated region comprises an area where the second electrode is located.

7. The array substrate according to claim 3, wherein the first electrode of the boosting capacitor is at least a portion of a second gate metal layer, and the second electrode of the boosting capacitor is a portion of the gate line in a first gate metal layer that overlaps the first electrode.

8. The array substrate according to claim 7, wherein the first electrode of the boosting capacitor is connected to a connecting electrode in a data line layer through a via hole, and the connecting electrode is a conductive line in the data line layer connecting the control terminal of the third transistor and the second terminal of the first transistor.

9. The array substrate according to claim 3, wherein the first electrode of the boosting capacitor is at least a portion of a connecting electrode of a data line layer, and the connecting electrode is a conductive line in the date line layer connecting the control terminal of the third transistor and the second terminal of the first transistor, and the second electrode is a portion of a second gate metal layer that overlaps the connecting electrode.

10. The array substrate according to claim 9, wherein the second electrode is connected to the gate line of a first gate metal layer through a via hole.

11. The array substrate according to claim 3, wherein the first transistor, the second transistor, the third transistor, the fourth transistor, the fifth transistor, the sixth transistor, and the seventh transistor are thin film transistors.

12. The array substrate according to claim 11, wherein the thin film transistors are made of low temperature polysilicon.

13. The array substrate according to claim 1, wherein the light emitting device is an OLED, and the first and second terminals of the light emitting device are an anode and a cathode of the OLED, respectively.

14. A display panel, comprising the array substrate according to claim 1.

15. A display apparatus, comprising the display panel according to claim 14.

* * * * *